United States Patent [19]

Kimura

[11] Patent Number: 4,762,126
[45] Date of Patent: Aug. 9, 1988

[54] SHOCK WAVE GENERATING APPARATUS

[75] Inventor: Shuzo Kimura, Ichikawa, Japan

[73] Assignees: Yachiyoda Sangyo Co., Ltd., Tokyo; Yachiyoda Kogyo Co., Ltd., Chiba, both of Japan

[21] Appl. No.: 918,336

[22] Filed: Oct. 14, 1986

[30] Foreign Application Priority Data

Oct. 17, 1985 [JP] Japan ................................ 60-157788

[51] Int. Cl.$^4$ ............................................. A61B 17/00
[52] U.S. Cl. .................................................... 128/328
[58] Field of Search ............................ 89/33.1, 33.02; 128/24 A, 305, 328; 116/137 R, 137 A; 181/116, 142; 102/305, 307; 175/310

[56] References Cited

U.S. PATENT DOCUMENTS

| 3,088,378 | 5/1963 | Boudreaux | 89/33.02 X |
| 3,720,133 | 3/1973 | Jampy et al. | 89/33.1 X |
| 4,605,003 | 8/1986 | Oimuma et al. | 128/328 |
| 4,620,545 | 11/1986 | Schene et al. | 128/328 |

FOREIGN PATENT DOCUMENTS 2724324 8/1978 Fed. Rep. of Germany ...... 128/328

Primary Examiner—Francis J. Jaworski
Attorney, Agent, or Firm—Sandler & Greenblum

[57] ABSTRACT

A shock wave generating apparatus is provided which includes a shock wave generating chamber and a rotatable carousel in which a plurality of microexplosive carrying members are removeably positioned. Each of the microexplosive carrying members are adapted to be pushed downwardly by a piston through a bore in the casing body and into a shock wave generating chamber. The microexplosive is detonated by heating a detonator adjacent to the explosive by virtue of electrical contact between the microexplosive carrying member and the piston, and activation of a microswitch. Alternately, the housing for the microexplosive carrying members can include a spring for forcing the members over the bore, with each member being forced downwardly by an piston to detonate an explosive charge.

32 Claims, 8 Drawing Sheets

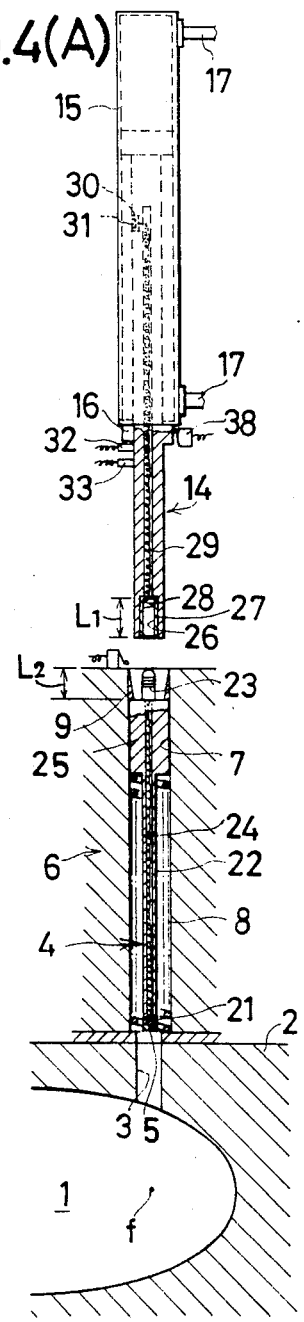
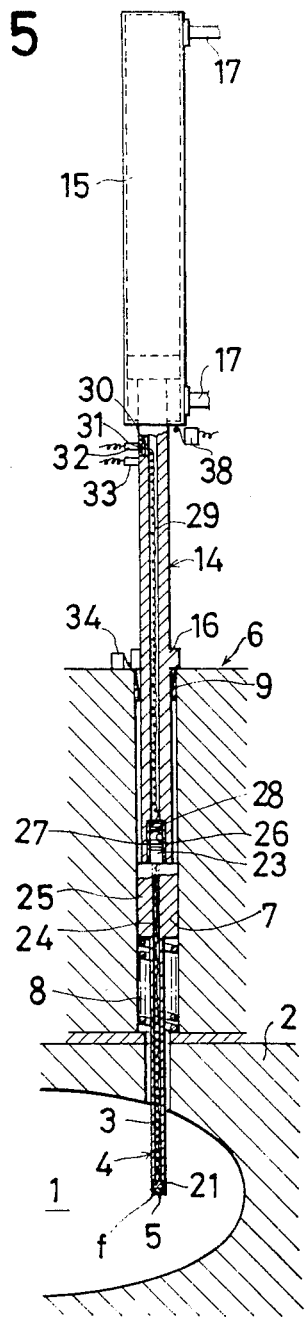

SHOCK WAVE GENERATING APPARATUS

FIELD OF THE INVENTION

The present invention generally relates to a shock wave generating apparatus used to disintegrate a calculus or calculi in the human body, or for other purposes; and more specifically to a shock wave generating device which detonates a plurality of microexplosives in a shock wave generating chamber in a serial fashion.

DISCUSSION OF PRIOR ART

The present Applicant has previously proposed a shock wave generating apparatus utilizing a microexplosive which serves as an apparatus for disintegrating calculus or calculi in the human body. In cases in which a relatively large calculus must be disintegrated using this apparatus, it has been necessary to detonate more than 100 microexplosives, rather than a large explosive device, in order to minimize bad effects on the human body immersed in a chamber adjacent to the shock wave generating apparatus. These microexplosives are each relatively small in energy and are exploded in an intermittent fashion within the shock wave generating chamber.

However, such an apparatus is inconvenient in that it is troublesome to detonate the explosives in such fashion and takes a great deal of time to complete the intermittent operation.

SUMMARY OF THE INVENTION

The present invention thus has as a general object providing of a shock wave generating apparatus which is free from the inconveniences of the above-noted device.

In a first aspect, the present invention comprises a shock wave generating apparatus having a main body portion having an internal shock wave generating chamber, and a casing adapted to retain a plurality of explosive carrying members, each of said explosive carrying members adapted to be charged at a first end with a microexplosive, said apparatus further comprising a pushing member comprising means for pushing individual explosive carrying members from said casing into said chamber, means for driving said pushing member until said microexplosive at said end of each said explosive carrying member reaches a predetermined position within said shock wave generating chamber, said apparatus further comprising means for successively moving one of said explosive carrying members through a bore in said body and into said shock wave generating chamber, and means for conveying said explosive carrying member to a position aligned with said bore when said pushing or actuating means is in an inoperative position, each of said explosive carrying members and each of said pushing members including electrically conductive members which are adapted to be connected, wherein said pushing member is adapted to push each of said explosive carrying members into a position in which said microexplosive reaches said predetermined position within said shock wave generating chamber, and said electrically conductive members contact each other, wherein said microexplosive will be detonated in response to said contact.

The casing is substantially cylindrical and has an outer periphery with a plurality of through openings located adjacent to said periphery.

The shock wave generating apparatus is used in combination with a plurality of explosive carrying members, respective explosive carrying members being positioned within respective openings in said cylindrical casing. The casing comprises a rotatable carousel and is adapted to be rotatably driven by a driving assembly.

Alternately, the casing comprises a hollow housing, with the plurality of explosive carrying members being positioned in aligned fashion in a row within the housing, an interior wall of said housing comprising a spring attached thereto which is adapted to push said aligned explosive carrying members towards an opposed interior wall of said hollow housing, said opposed wall of said housing comprising an opening adapted to receive a relatively large diameter end of one of said explosive carrying members when said carrying member is in an elevated position.

The pushing member includes a hook, and each of said carrying members includes a groove about its periphery adjacent an upper end of each said carrying member, said hook being adapted to engage said groove.

In another aspect the present invention provides a shock wave generating apparatus comprising a main body portion having a top surface, an internal shock wave generating chamber, and a bore connecting said top surface with said chamber, means for holding a plurality of explosive carriers and for indexing individual explosive devices in alignment over said bore, means for pushing each of said explosive carriers into said bore when each said explosive carrier is positioned over said bore, and means for detonating each of said explosive carriers when each said explosive carrier is positioned at a predetermined point within said shock wave generating chamber.

The holding means comprises a rotatable carousel having a plurality of apertures extending vertically along said carousel, said apertures being located about the periphery of said carousel.

The shock wave generating apparatus further comprises drive means and a plurality of gears driven by said drive means, said carousel being positioned on one of said gears, wherein said carousel is rotated by said drive means and said gears, said carousel being rotatable about a central substantially vertical axis.

The means for pushing said carriers into said bore comprises a vertically driven, pneumatically operable piston.

The pushing member or piston rod is substantially cylindrical and has a central bore with electrically conductive material positioned within said central bore. A lower end of said pushing member is recessed, with a metal spring being positioned within said recessed end and being attached to said electrically conductive material within said central bore of said pushing member.

The shock wave generating apparatus is to be used in combination with a plurality of explosive carrying members, each of said carrying members being positioned within one of said apertures of said carousel, each of said explosive carrying members being biased upwardly by a spring within said carousel, each carrying member having a metal head at an upper end thereof, said upper heads being adapted to fit within said recessed end of said pushing member.

Each of said explosive carrying members includes a generally tubular rod having a first end connected to said metal head and a second end attached to an explosive detonator.

An electric heater is embedded within the detonator, said electric heater having a first end connected to said tubular rod and a second end attached to an electrically conductive member positioned within a central bore of said rod and attached to said head, said heater comprising means for detonating said detonator and an explosive device in each of said explosive carrying members. An explosive device is attached to each said detonator.

The pushing member includes a peripheral flange which is adapted to engage said upper body surface and serves as a limit to the substantially downward vertical motion of said pushing member. A microswitch is located adjacent said upper surface of said body, said microswitch being adapted to be activated by engagement with said flange when said pushing member is moved downwardly.

The holding means can comprise a stationary housing having a plurality of aligned explosive carrying members positioned in a row therein, said stationary housing having a first inner wall with a spring extending generally perpendicular thereto and adapted to move over said base in a generally horizontal fashion. The stationary housing also comprises a side wall opposed to said first wall to which said spring is attached, said second wall having a notch located at an upper end thereof, said notch comprising means for permitting a relatively wide upper end of each of said explosive carrying members to be removed from said housing.

The pushing member includes a central bore having electrically conductive material therein; and has a lower end with an engaging hook extending downwardly from said lower end.

Each of the explosive carrying members includes a peripheral notch adjacent an upper end of each said member, said peripheral notch being adapted to be engaged by said hook, said hook thereby comprising means for elevating each of said carrying members from said carousel.

In yet another aspect, the present invention discloses a method for treating a body immersed in a liquid adjacent to a shock wave generating apparatus. The method comprises successively and intermittently moving a plurality of explosive carrying members over a bore in a base of said apparatus, said base including an inner shock wave generating chamber which communicates with an upper surface of said base via said bore, intermittently pushing the explosive carrying members positioned over said bore into said shock wave generating chamber, detonating an explosive device located at a lower end of each of said explosive carrying members, and withdrawing said explosive carrying member from said shock wave generating chamber after detonation.

The step of moving said explosive carrying members over said bore comprises rotating a carousel having a plurality of said explosive carrying members positioned in a substantially vertical position therein in an intermittent fashion to index said explosive carrying members over said bore. The carousel is rotated by a gear assembly which is driven by a drive motor.

The explosive carrying members are pushed longitudinally to index respective explosive carrying members after withdrawing a previous explosive carrying member from said shock wave generating chamber; and the explosive carrying members can each be pushed by a spring.

The method further comprises driving a pushing member downwardly with a pneumatic cylinder so that a lower end of said pushing member will engage an upper end of a respective explosive carrying member over said bore and force said explosive carrying member into said shock wave generating chamber.

An electrical connection is established between said pushing member and respective ones of said explosive carrying members so that activation of a microswitch will activate a heater positioned within a detonator located at a lower end of each said carrying member, which detonator is adjacent to an explosive device.

The explosive carrying members are elevated from said shock wave generating chamber by a spring which biases said members upwardly within apertures in an explosive carrying member carousel. The explosive carrying members are elevated from said shock wave generating chamber by using a hook at a lower end of a pushing member to engage an upper peripheral recess on each of said explosive carrying members.

In accordance with still another aspect of the present invention, a shock wave generating apparatus is provided which includes a shock wave generating chamber, and a casing in which a plurality of explosive carrying members, each charged at its forward end portion with a microexplosive, are disposed in a line. The apparatus also includes a pushing member positioned so as to face a through bore of the shock wave generating chamber and which comprises means for pushing individual ones of the plurality of explosive carrying members within the casing. An actuator is provided for driving the pushing member until the microexplosive located at the forward end of each explosive carrying member reaches a predetermined position within the shock wave generating chamber. The apparatus further comprises a conveying device which carries one of the explosive carrying members at a time to a position aligned with a through bore of the apparatus when the pushing means is in its inoperative position. Each of the explosive carrying members and each of the pushing members are respectively provided with electrical conductors for exploding the microexplosive. These electrical conductors are provided so that when the push member pushes each of the explosive carrying members to a predetermined position at which the microexplosive is positioned within the shock wave generating chamber, the microexplosive will be exploded by virtue of contact of the two electric conductors with each other.

BRIEF DESCRIPTION OF THE DRAWINGS

The above and other objects, features and advantages of the present invention will be discussed more fully hereinafter with respect to the accompanying drawings, in which like reference numerals represent like parts throughout, and wherein:

FIG. 4A is an enlarged sectional view of the pushing member and the cylindrical casing of the embodiment of FIG. 1;

FIG. 5 is an enlarged sectional view of the invention similar to that in FIG. 4A, but in a different position;

DETAILED DESCRIPTION OF THE DRAWINGS

Figure 1:
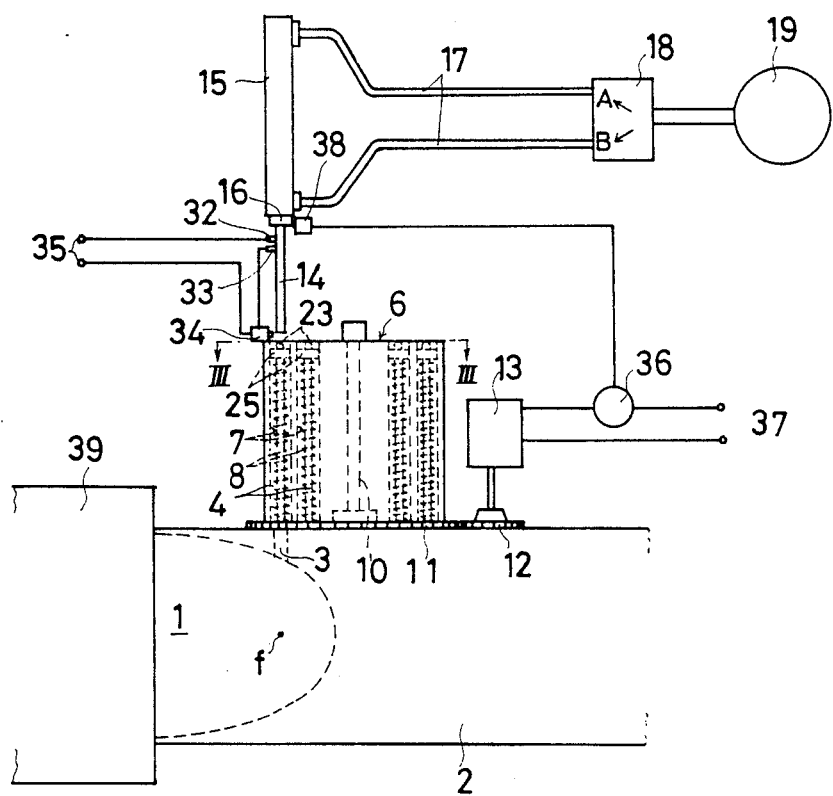
FIG. 1 is a side plan view of a first embodiment of the present invention when in its inoperative condition.

Referring more specifically to the drawings, FIGS. 1-5 illustrate a first embodiment of the present invention. The apparatus includes a shock wave generating chamber 1 formed at one end of a base 2. The interior wall of the generating chamber 1 has the shape of a pseudo-ellipsoid of revolution. Base body 2 has a through opening or bore 3 which communicates the upper surface (on reference) of base 2 with the interior of shock wave generating chamber 1. In this manner, an explosive carrying member or rod 4 can be introduced through the through opening 3 into the shock wave generating chamber so that a microexplosive 5 positioned at the forward end portion of member 4 can be located at a focus position f of the pseudo-ellipsoid of revolution of chamber 1.

Figure 3:
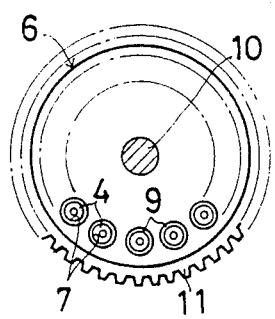
FIG. 3 is a sectional view taken along line III—III of FIG. 1.
Figure 4B:
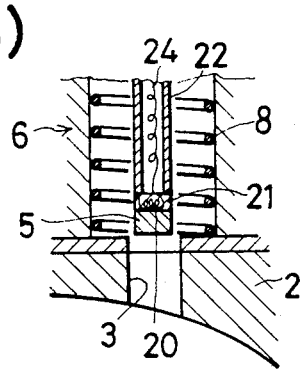
FIG. 4B is an even more greatly enlarged view of a portion of the cylindrical casing and the shock wave generating chamber of FIG. 1.

An explosive carrying member 4 is mounted in each of a plurality of generally vertically extending receiving openings 7 provided in a substantially cylindrical casing or carousel 6, which is best illustrated in FIG. 3. The receiving openings are located substantially about the periphery or circumferential edge portion of casing 6; each explosive carrying member 4 is positioned in an opening 7 and is ordinarily pushed upwardly against a stopper 9 (see FIG. 4) by the biasing force of a spring 8 which is positioned within each receiving opening 7. Cylindrical casing 6 is attached via its central axial shaft 10 to a turning gear 11 which also serves as a support base for the cylindrical casing. This gear is connected, via gear 12 which meshes with it, to a driving member 13 so that when driving means 13 is actuated it rotates gear 12, gear 11, shaft 10, and cylindrical casing 6. The assembly of elements 6, 10, 11, 12 and 13 comprise a conveying assembly for explosive carrying members 4. A pushing member 14 for driving explosive carrying members 4 in a generally vertical fashion is adapted to be located above the upper surface of casing 6 and is aligned with the axis of the through bore 3 in base 2 so that when each of the explosive carrying members 4 positioned within an opening 7 in casing 6 is brought into alignment with the axis of the opening, it can be pushed downwardly therethrough, as illustrated in FIGS. 4A and 5.

Figure 2:
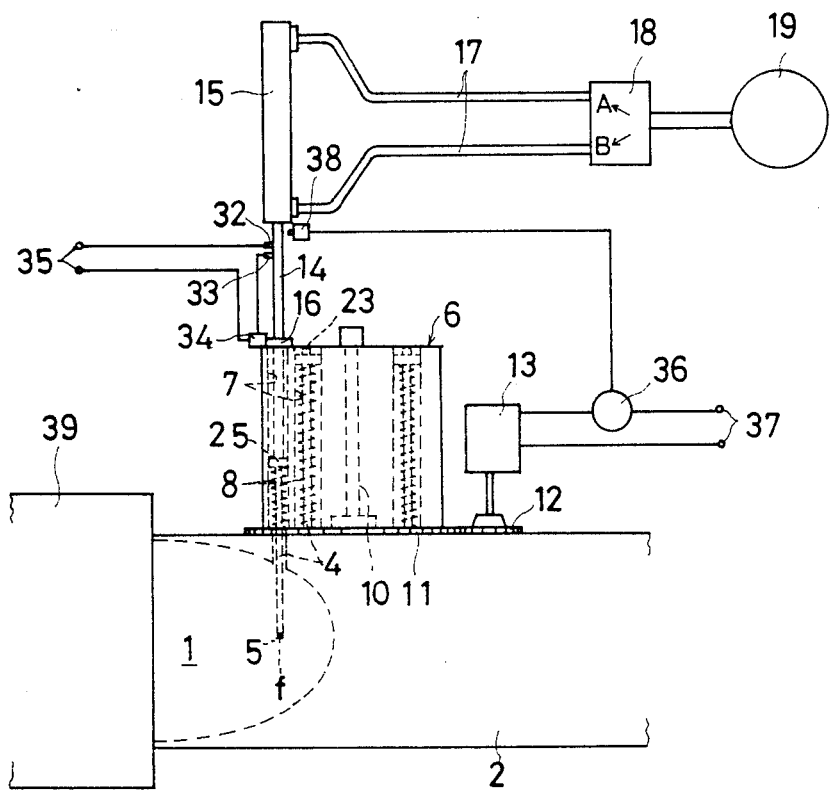
FIG. 2 is a plan view illustrating the embodiment of FIG. 1 when in its operative position.

In the first embodiment of the invention, pushing member 14 comprises a piston rod which is actuated by air cylinder 15. The lowest position which pushing member 14 can occupy causes microexplosive 5 at the forward end of each explosive carrying member 4 to reach focus position f in chamber 1. In this position, stopper 16, provided on pushing member 14, is brought into abutment with casing 6. As is conventional, an air cylinder 15 is connected to air pump 19 via advancing and returning air tubes 17 which are respectively connected to upper and lower end portions of the cylinder. The air pump is connected to the air tubes by a changeover valve 18, as illustrated in FIG. 2.

Each explosive carrying member 4 is provided at a first forward end thereof (i.e., its lower end portion) with a microexplosive 5, as discussed above. It is additionally provided at that area with an initial explosive or detonator 21 having an electric heater 20 incorporated therein (as seen in FIG. 4a), which heater is adapted to be contacted with microexplosive 5; and one end of heater 20 is adapted to abut metallic rod member 22, with its other end being connected to an electrical conductor 24. The other end of the electrical conductor is itself connected to a metallic head portion 23 (see FIG. 4a) which is insulated from metallic rod 22. Actuation member 14 is provided at its forward, i.e., lower end, portion with a cavity or recessed area 26 which is adapted to receive the "male-shaped" metallic head portion 23 of explosive carrying member 4. Depth $L_1$ of the recessed portion 26 is greater than depth $L_2$, as measured from the top end of metallic head portion 23 to the top surface of the enlarged portion 25 of each explosive carrying member 4. The recessed portion 26 has an inner wall surface which is covered with an insulating material 27 and which is provided along its bottom portion with a metallic spring contact 28 (see FIG. 5). One end of an insulated electrical conductor 29 is provided in a hollow portion of pushing member 14 and is connected to metallic spring 28, with the other end of the electric conductor 29 being connected to an electrode 31 extending from a peripheral surface portion of pushing member 14 through insulating material 30 (see FIG. 5).

A stationary terminal 32 is provided at a position along pushing member 14 which is positioned so that it will contact electrode 31 when pushing member 14 is pushed downwardly into its lower limit position; and a second stationary terminal 33 is in continuous contact with the outer periphery of the metallic outer body of pushing member 14.

Terminals 32 and 33 are connected to an electric source 35 through a microswitch 34 (see FIG. 2) which is closed by flange 16 when the flange reaches its abutment position with the upper surface of casing 6, as illustrated in FIG. 5. In this manner, when microexplosive 5 is moved into focal position f within shock wave generating chamber 1, as illustrated in FIGS. 2 and 5, electric current flows from electric source 35, through stationary terminal 32, electric conductor 29, metallic spring 2S, metallic head portion 23, electric conductor 24, electric heater 20, metallic rod member 22, the enlarged diametrical portion 25 of explosive charge carrier 4, the main body of pushing member 14, stationary terminal 33, and microswitch 34, to thereby detonate microexplosive 5 via the detonation of detonator 21.

Driving assembly 13 can be a substantially conventional structure, e.g., it can comprise an electromagnet, a ratchet wheel, and a ratchet claw which are operated in response to energization of the electromagnet to turn the wheel by a predetermined amount. The driving assembly 13 is connected to electric source 37 via switch 36. Switch 36 is connected to a source of electricity (not illustrated) through microswitch 3S, which is positioned so that it is closed by flange 16 when pushing member 14 is returned upwardly into its original position. In this manner, driving assembly 13 is energized by electrical source 37 via switch 36, which is closed when pushing member 14 is returned to its initial position. Casing 6 will then be rotated by gears 11 and 12 over one displacement pitch of explosive carrying members 4. In this manner, successive explosive carrying members 4 can be presented to the bore 3 of base body 2 so that they can be moved downwardly and detonated.

A liquid tank 39 within which a human body is immersed is positioned directly adjacent to base body 2 and the calculus or calculi to be disintegrated is positioned at the second focal point of the pseudo-ellipsoid of revolution.

The operation of the first embodiment of the apparatus in the present invention will now be described in greater detail. Initially, a human body is immersed within the liquid in tank 39 so that the calculus part of the body will be positioned at the second focused position (not shown) of the above-noted pseudo-ellipsoid of revolution.

At an initial stage, pushing member 14 is located at the position illustrated in FIGS. 1 and 4A. From this condition, a change over valve 18 is in fact "changed over" to the side designated by "A" in FIG. 2; pushing member 14 will be then operated by pneumatic cylinder 15 to move a selected explosive carrying member 4 to the lower limit position as illustrated in FIGS. 2 and 5. In this fashion, microexplosive 5 is locatad at the focus position f within shock wave generating chamber 1, as shown in FIG. 5. Simultaneously, movement of pushing member 14 connects electric heater 20 to electric source 35 through electric conductor 24, metallic head portion 23, spring 28, electric conductor 29, metallic rod member 22, the enlarged diameter portion 25 of member 4, and the main body of pushing member 14. In this fashion, microexplosive 5 is detonated through the explosion of detonator 21, which is caused by the heating of heater 20. In this manner, a shock wave is generated in the shock wave generating chamber 1 and any calculus in the human body at the second focal position will be at least partially broken.

Thereafter, change-over valve 18 is then changed over to the side referenced by "B", with pushing member 14 thereby returned to its initial position. Switch 36 is then enclosed and driving means 13 is thereby energized. The first explosive carrying member in which microexplosive 5 had been exploded is then withdrawn from chamber 1 back into casing 6 while under the biasing action of spring 8, so that it will not prevent or obstruct subsequent turning of casing 6. Driving means 13, which has been energized, rotates carousel 6 via gears 11 and 12 so that the explosive carrying member 4 next to the first explosive carrying member 4 which has already been detonated will be rotated by one pitch and positioned directly above through bore 3 of base 2. Changing change-over valve 18 back to its A position will then cause the above-noted operation to be repeated.

Figure 6:
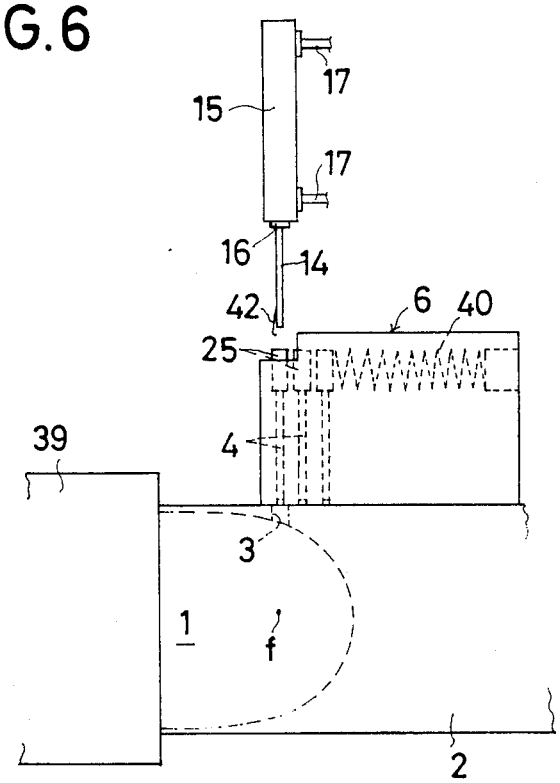
FIG. 6 is a side plan view of a second embodiment of the present invention.
Figure 7:
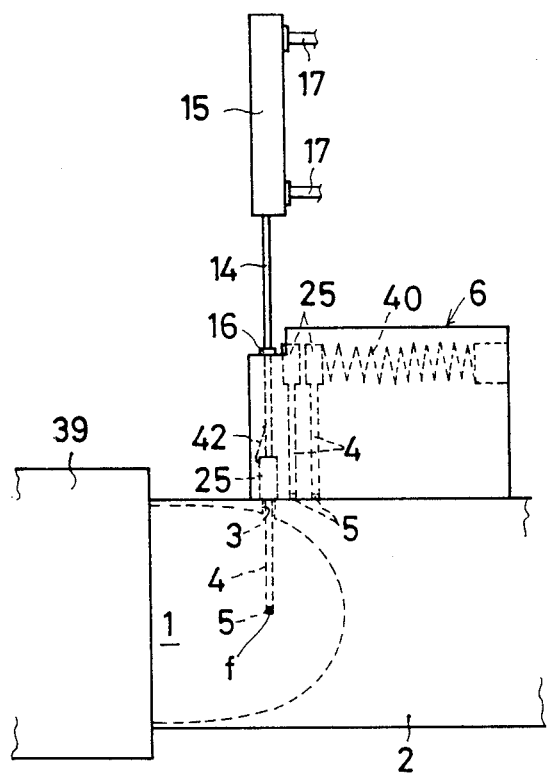
FIG. 7 is a side view of the embodiment of the invention of FIG. 6 when in its operative position.
Figure 8:
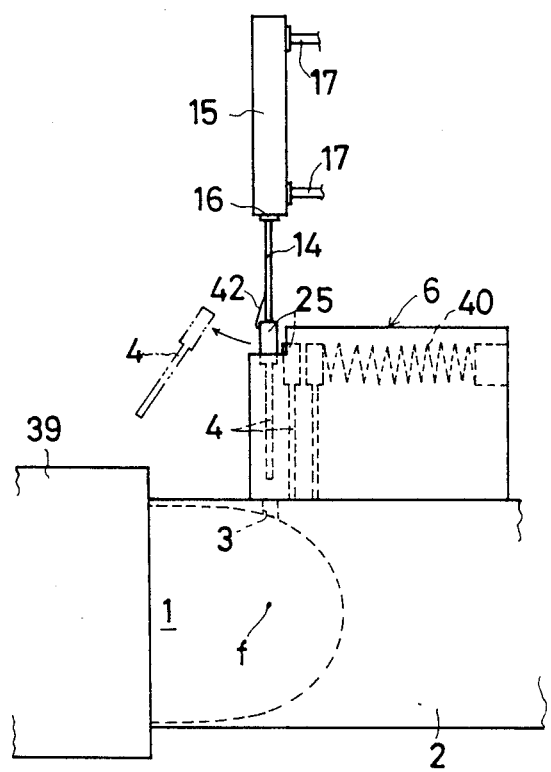
FIG. 8 is a side view of the invention of the embodiment of FIG. 6 when lifting an exploded carrier out of its holder.
Figure 9:
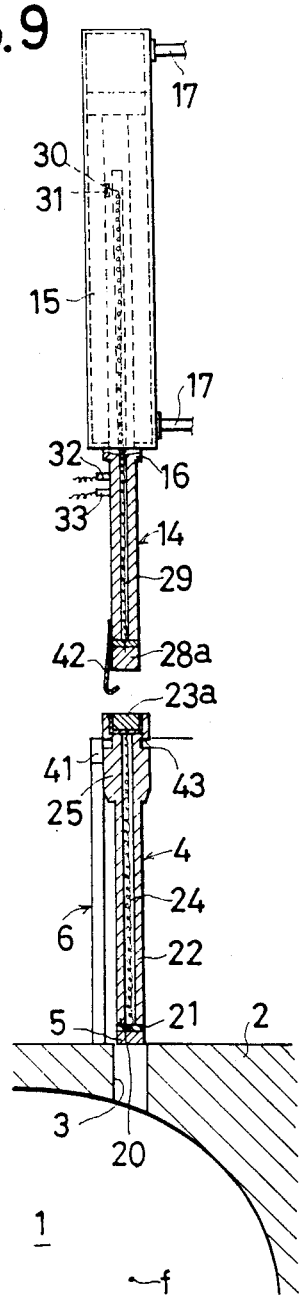
FIG. 9 is an enlarged sectional view of the embodiment of FIG. 6 which is similar to the view of FIG. 4A.
Figure 10:
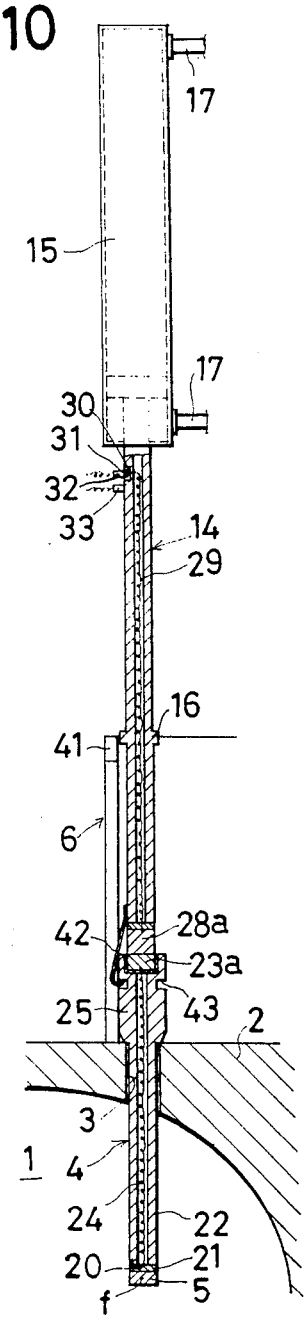
FIG. 10 is an enlarged sectional view of the embodiment of the invention of FIG. 6 similar to the view in FIG. 5.
Figure 11:
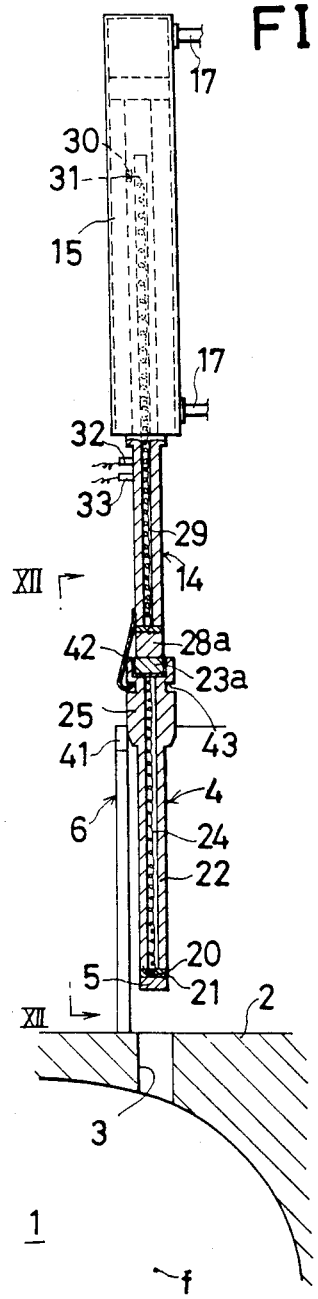
FIG. 11 is an enlarged sectional view of the embodiment of the invention of FIG. 6 when in a third position.
Figure 12:
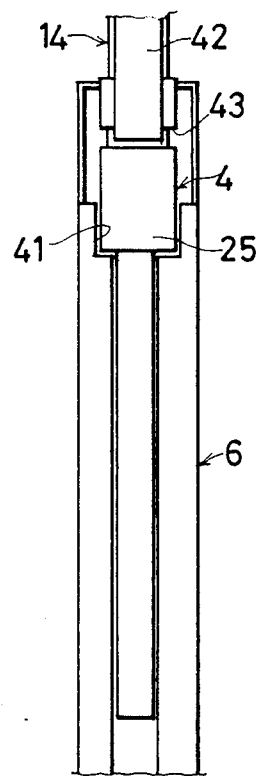
FIG. 12 is a sectional view of the invention taken along line XII—XII of FIG. 11.

FIG. 6-12 illustrate a second embodiment of the present invention, which is not drastically different from the embodiment illustrated in FIGS. 1-5. In this embodiment, casing 6 comprises a hollow housing, with a plurality of explosive carrying members 4 positioned in the hollow portion of the housing in an aligned fashion with their enlarged diametrical portions 25 adjacent to each other. These portions are pushed leftwardly, as viewed in FIG. 6, by a spring 40 attached to the interior surface of one side wall of casing 6. The other wall of the casing is provided with a recessed release opening 41 (see FIGS. 9 and 10) so that the last of the aligned microexplosive carrying members 4 will not escape from the housing when it is in its ordinary position, as illustrated in FIGS. 6 and 9. In other words, each microexplosive carrying member 4 will engage a side wall of casing 6 but can only be removed therefrom when in its elevated position, as shown in FIGS. 8, 11, and 12. Essentially, this comprises a "keyhole slot" which prevents each member from being moved outwardly from the hollow housing 6 in a longitudinal direction but permits it to be first elevated above the recessed portion 41 and then withdrawn in a longitudinal manner.

Additionally, pushing member 14 is provided with a hook member 42 so that when pushing member 14 is brought into abutment with the upper end portion 25 of an explosive carrying member 4, its lower end portion 28a (corresponding to contact portion 28 in the embodiment of FIGS. 1-5) will engage end portion 23a of carrying member 4 (which generally corresponds to head portion 23 of the embodiment of FIGS. 1-5). In this position, hook 42 will engage a groove 43 along the periphery of carrying member 4 (see FIG. 9), so that when pushing member 14 is moved upwardly and returned to its upper limit position, carrying member 4 will follow the pushing member and, when it reaches the position illustrated in FIGS. 8 and 11, will escape release opening 41 and can be removed from the housing. Once this member is removed, the next explosive carrying member 4 can be brought into abutment with the side wall of casing 6 under the biasing action of spring 40.

Hook member 42 can be formed from a flexible metallic material and can serve, in addition to serving to physically connect the pushing member with carrying member 4, to electrically connect the metallic main body of pushing member 14 and the metallic main body portion of microexplosive carrying member 4.

Thus, the embodiment of FIGS. 6-12 can work in a fashion quite similar to that described with respect to FIGS. 1-5. Namely, pushing member 14 is moved downwardly under the action of a piston of air cylinder 15 from its position of FIGS. 6 and 9, so that its lower end portion 28a will contact the upper end portion 23 of explosive carrying member 4. At this time, hook member 42 will engage groove 43. If the carrying member 4 is then pushed so that it reaches it lower limit position, microexplosive 5 will be located at focus position f of the pseudo-ellipsoid of revolution of shock wave generating chamber 1; and an electric current will flow through heater 20, through electric conductors 24 and 29, to detonate microexplosive 5 via the explosion of the initial explosive or detonator 21. This will serve to generate an appropriate shock wave within shock wave generation chamber 1.

If pushing member 14 is then moved upwardly by the retreating air cylinder air 15, carrying member 4 will follow pushing member 14 upwardly by virtue of the connection between hook 42 and groove 43 on carrying member 44. Once the carrying member 4 is brought into the elevated position which is illustrated in FIGS. 8, 11, and 12, it will then be pushed so that it can escape outwardly from the recess through opening 41 under the action of spring 40. As shown by the imaginary lines of FIG. 8, the next carrying member 4 will then be simultaneously pushed leftwardly within casing 6 under the action of spring 40 so that it will be positioned directly above through bore 3. Thereafter, when piston member 14 is returned to its initial position, the process can be repeated simply by operating air cylinder 15 again.

Thus, in accordance with the present invention, a plurality of microexplosive carrying members are positioned within a casing and are arranged to be pushed, one at a time, by a pushing member in order to effect intermittent microexplosions within a chamber. In this manner, a plurality of shock waves can be generated in a simple manner and in a relatively short time frame, and can be remotely controlled.

The above embodiments of the invention have been presented as illustrative examples only, and equivalents to the specific details of the invention would be within the skill of ordinary skill in the art.

What is claimed is:

1. A shock wave generating apparatus comprising a main body portion having an internal shock wave generating chamber with a predetermined shake and at least one focal point; and a casing adapted to retain a plurality of explosive carrying members, each of said explosive carrying members adapted to be charged at a first end with a microexplosive, said first ends of said explosive carrying members thereby comprising means for receiving said microexplosives, said apparatus further comprising means adapted for pushing individual explosive carrying members from said casing into said chamber, means for driving said means for pushing until said first end of each said explosive carrying member reaches a predetermined position within said shock wave generating chamber, said predetermined position being substantially located at one of said focal points said apparatus further comprising means adapted for moving successive individual explosive carrying members over an upper end of a bore in said body portion, wherein said pushing means is adapted to push said explosive carrying members into said shock wave generating chamber, said moving means including means adapted for conveying each of said explosive carrying members to a position aligned with said bore when said pushing means is in an inoperative position, each of said explosive carrying members and said means for pushing including electrically conductive members wherein said electrically conductive members on said means for pushing are adapted to be connected to said electrically conductive members on said explosive carrying members, wherein when said electrically conductive members contact each other, each said microexplosive will be electrically detonatable after said contact is established.

2. A shock wave generating apparatus in accordance with claim 1 wherein said casing is substantially cylindrical and has an outer periphery with a plurality of through openings located adjacent to said periphery.

3. A shock wave generating apparatus in accordance with claim 2 in combination with a plurality of explosive carrying members, respective explosive carrying members being positioned within respective openings in said cylindrical casing.

4. A shock wave generating apparatus in accordance with claim 2 wherein said conveying means comprises said casing, which casing comprises a rotatable carousel which is adapted to be rotatably driven by a driving assembly.

5. A shock wave generating apparatus according to claim 1, wherein said casing comprises a hollow housing, said plurality of explosive carrying members being positioned in a row within said housing, said conveying means being attached to an interior wall of said housing and comprising a spring attached to said housing which is adapted to push said aligned explosive carrying members towards an opposed interior wall of said hollow housing, said opposed wall of said housing comprising an opening adapted to receive a relatively large diameter end of each one of said explosive carrying members.

6. A shock wave generating apparatus in accordance with claim 5, wherein said pushing member includes a hook and wherein each of said carrying members includes a groove about its periphery adjacent an upper end of each said carrying member, said hook being adapted to engage said groove.

7. A shock wave generating apparatus comprising:
   (a) a main body portion having a top surface, an internal shock wave generating chamber having an interior surface with a predetermined shape and at least one focal point, and a substantially vertical bore connecting said top surface with said interior chamber surface.
   (b) means for holding a plurality of explosive carrying members and for indexing individual carrying members, which hold individual explosive devices at respective lower ends of said members in alignment over said bore;
   (c) means for pushing each of said explosive carrying members downwardly into said bore when each said explosive carrying member is positioned over said bore, such that said lower ends are positioned substantially at said focal point; and
   (d) means for detonating each said explosive devices when a respective explosive carrying member is positioned substantially at said focal point within said shock wave generating chamber.

8. A shock wave generating apparatus in accordance with claim 7 wherein said holding means comprises a rotatable carousel having a plurality of apertures extending vertically through said carousel, said apertures being located about the periphery of said carousel.

9. A shock wave generating apparatus in accordance with claim 8 further comprising drive means and a plurality of gears driven by said drive means, said carousel being positioned on one of said gears, wherein said carousel is rotated by said drive means and said gears, said carousel being rotatable about a central substantially vertical axis.

10. A shock wave generating apparatus in accordance with claim 8 wherein said means for pushing said carriers into said bore comprises a piston which is driven vertically downwardly by a pneumatic cylinder.

11. A shock wave generating apparatus in accordance with claim 10 wherein said piston is substantially cylindrical and has a central bore with electrically conductive material positioned within said central bore.

12. A shock wave generating apparatus in accordance with claim 11 wherein a lower end of said piston is recessed, a metal spring being positioned within said recessed end and being attached to said electrically conductive material within said central bore of said piston.

13. A shock wave generating apparatus in accordance with claim 12 in combination with a plurality of explosive carrying members, each of said carrying members being positioned within one of said apertures of said carousel, each of said explosive carrying members being biased upwardly by a spring within said carousel, a metal head being located at an upper end of each said carrying member, said head being adapted to fit within said recessed end of said piston.

14. A shock wave generating apparatus in accordance with claim 13, wherein each of said explosive carrying members includes a generally tubular rod having a first end connected to said metal head and a second end attached to an explosive detonator.

15. A shock wave generating apparatus in accordance with claim 14 further comprising an electric heater embedded within said detonator, said electric heater having a first end connected to said tubular rod and a second end attached to an electrically conductive member positioned within a central bore of said rod and attached to said head, said heater comprising means for detonating said detonator and an explosive device in each of said explosive carrying members.

16. A shock wave generating apparatus in accordance with claim 15 wherein an explosive device is attached to each said detonator.

17. A shock wave generating apparatus in accordance with claim 10 wherein said piston includes a peripheral flange which is adapted to engage said upper body surface and serves as a limit to substantially downward vertical motion of said piston.

18. A shock wave generating apparatus in accordance with claim 17 further comprising a microswitch located adjacent said upper surface of said body, said microswitch being adapted to be activated by engagement with said flange when said piston is moved downwardly.

19. A shock wave generating apparatus in accordance with claim 7 wherein said holding means comprises a stationary housing having a plurality of aligned explosive carrying members positioned in a row therein, said stationary housing having a first inner wall with a spring extending generally perpendicular thereto and adapted to move over said base in a generally horizontal fashion.

20. A shock wave generating apparatus in accordance with claim 19 wherein said stationary housing further comprises a second wall opposed to said first wall to which said spring is attached, said second wall having a notch located at an upper end thereof, said notch comprising means for permitting a relatively wide upper end of each of said explosive carrying members to be removed from said housing.

21. A shock wave generating apparatus in accordance with claim 20 wherein said piston includes a central bore having electrically conductive material therein.

22. A shock wave generating apparatus in accordance with claim 21 wherein said piston has a lower end with an engaging hook extending downwardly from said lower end.

23. A shock wave generating apparatus in accordance with claim 22 wherein each of said explosive carrying members includes a peripheral notch adjacent an upper end of each said member, said peripheral notch being adapted to be engaged by said hook, said hook thereby comprising means for elevating each of said carrying members from said carousel.

24. A method or treating a body immersed in a liquid adjacent to a shock wave generating apparatus, said method comprising:
(a) successively and intermittently moving, in a substantially horizontal fashion, a plurality of explosive carrying members over a bore in a base of said apparatus, said base including an inner shock wave generating chamber which communicates with an upper surface of said base via said bore, said chamber having an interior surface of a predetermined shape and at least on focal point, said explosive carrying members being moved over said base;
(b) intermittently pushing individual explosive carrying members, when positioned over said bore, downwardly into said shock wave generating chamber such that an explosive device at one end of each member is substantially positioned at one said focal point;
(c) detonating said explosive device located at said end of each of said explosive carrying members and;
(d) withdrawing said explosive carrying members from said shock wave generating chamber after detonation.

25. A method in accordance with claim 24 wherein said step of moving said explosive carrying members over said bore comprises rotating a carousel having a plurality of said explosive carrying members positioned in a substantially vertical position therein in an intermittent fashion to index said explosive carrying members over said bore.

26. A method in accordance with claim 25 wherein said carousel is rotated by a gear assembly which is driven by a drive motor.

27. A method in accordance with claim 24 wherein said explosive carrying members are pushed longitudinally to index respective explosive carrying members after withdrawing a previous explosive carrying member from said shock wave generating chamber.

28. A method in accordance with claim 27 wherein said explosive carrying members are pushed by a spring.

29. A method in accordance with claim 24 further comprising pushing a piston downwardly with a pneumatic cylinder so that a lower end of said piston will engage an upper end of a respective explosive carrying member over said bore and force said explosive carrying member into said shock wave generating chamber.

30. A method in accordance with claim 29 further comprising establishing an electrical connection between said piston and respective ones of said explosive carrying members and activating a microswitch to activate a heater positioned within a detonator located at a lower end of each said carrying member, which detonator is adjacent to an explosive device.

31. A method in accordance with claim 24 wherein said explosive carrying members are elevated from said shock wave generating chamber by a spring which biases said members upwardly within apertures in an explosive carrying member carousel.

32. A method in accordance with claim 24 wherein said explosive carrying members are elevated from said shock wave generating chamber by using a hook at a lower end of the piston to engage in an upper peripheral recess on each of said explosive carrying members.

* * * * *

UNITED STATES PATENT AND TRADEMARK OFFICE
CERTIFICATE OF CORRECTION

PATENT NO. : 4,762,126

DATED : August 9, 1988

INVENTOR(S) : Shuzo KIMURA

It is certified that error appears in the above-identified patent and that said Letters Patent is hereby corrected as shown below:

At line 14 of the Abstract, change "an" to ---a---.

At column 6, line 54, change "2S" to ---28---.
At column 6, line 67, change "3S" to ---38---.
At column 7, line 30, change "locatad" to ---located---.
at column 8, line 49, "it", second occurrence, to read -- its --.
At column 9, line 21 (i.e., in claim 1, line 3) change "shake" to ---shape---.
At column 9, line 45 (i.e., in claim 1, line 27) add a comma after "members" and before "wherein".
At column 10, line 22 (i.e., in claim 7, line 7) change period after "surface" to a semi-colon.
At column 10, line 33 (i.e., in claim 7, line 18) insert "of" after "each" and before "said".
At column 12, line 1 (i.e., in claim 24, line 1) change "or" to ---for---.
At column 12, line 11 (i.e., in claim 24, line 11) change "on" to ---one---.
At column 12, line 20 (i.e., in claim 24, line 20) insert ---;--- after "members".

UNITED STATES PATENT AND TRADEMARK OFFICE
CERTIFICATE OF CORRECTION

PATENT NO. : 4,762,126

DATED : August 9, 1988

INVENTOR(S) : Shuzo Kimura

It is certified that error appears in the above-identified patent and that said Letters Patent is hereby corrected as shown below:

At column 12, line 21 (i.e., in claim 24, line 21) delete
";" after "and"

Signed and Sealed this

Eighteenth Day of July, 1989

Attest:

DONALD J. QUIGG

Attesting Officer

Commissioner of Patents and Trademarks